Nov. 25, 1958 L. J. KABELL 2,862,113

REGENERATIVE TRANSISTOR AMPLIFIER

Filed Feb. 14, 1955

INVENTOR:
L. J. Kabell
BY
Roland A. Anderson
Attorney

United States Patent Office 2,862,113

Patented Nov. 25, 1958

2,862,113

REGENERATIVE TRANSISTOR AMPLIFIER

Louis J. Kabell, Palo Alto, Calif., assignor, by mesne assignments, to the United States of America as represented by the United States Atomic Energy Commission Application February 14, 1955, Serial No. 488,167

2 Claims. (Cl. 307—88.5)

This invention relates to a regenerative transistor amplifier and, more particularly, to one that is operated by a synchronizing signal employed in computers.

The discovery of transistors has led to the development of amplifiers and switching circuits that have particular applications in computers. In many of the computers a synchronizing sine wave signal, hereinafter referred to as clock signal, is used to synchronize the computer system.

One example of a transistor amplifier for signal regeneration in computers is described in Patent No. 2,670,445 issued to Jean H. Felker, where the transistor is switched on by the clock signal at the base if an information signal is present at the emitter and is switched off by the clock signal at the base.

This regenerative amplifier, although it works satisfactorily, requires several different voltage sources for operation such as a negative potential for the collector, which serves to bias the collector in the so-called reverse direction. The emitter is returned to a positive potential through a "load-line" resistor. In addition, the emitter is returned to a small negative potential through a crystal diode; and a serially connected crystal diode in the input circuit is returned to a negative potential.

The regenerative transistor amplifier of this invention performs the same function as the above described amplifier but with reduced power required for the clock signal and reduced circuit power requirement. The power requirements are reduced in one way by employing transformer coupling which increases the collector circuit efficiency by eliminating the loss of power in the collector load resistor. In the use of transformer coupling it is necessary to limit the collector current of the transistor to a value which will permit shutoff by the clock signal which appears after the transistor has been in the high current state for a number of cycles. This situation could be caused by the loss of the clock signal for several cycles. Limiting the collector saturation current during the "on" period reduces the charge stored in the transistor and results in saving of power required to turn off the transistor. The saving in clock power is achieved by reducing the amount of clock signal absorbed by passive components in the circuit. A feature of the invention lies in that the direct potentials required for operation of the regenerative transistor amplifier are obtained by rectifying the clock power with crystal diodes.

It is therefore an object of this invention to provide a regenerative transistor amplifier having reduced clock signal power requirements.

A further object is to provide a regenerative transistor amplifier having smaller current requirements for a given output signal power.

Another object is to provide a bistable regenerative transistor amplifier which is turned on by a clock signal when an information signal permits and is turned off by the clock signal.

A further object is to provide a regenerative transistor amplifier that employs the clock signal for its operating potentials.

Other objects and advantages of the present invention will be apparent from the following specification taken in connection with the drawings made a part hereof and the description of a presently preferred embodiment.

Figure 1:
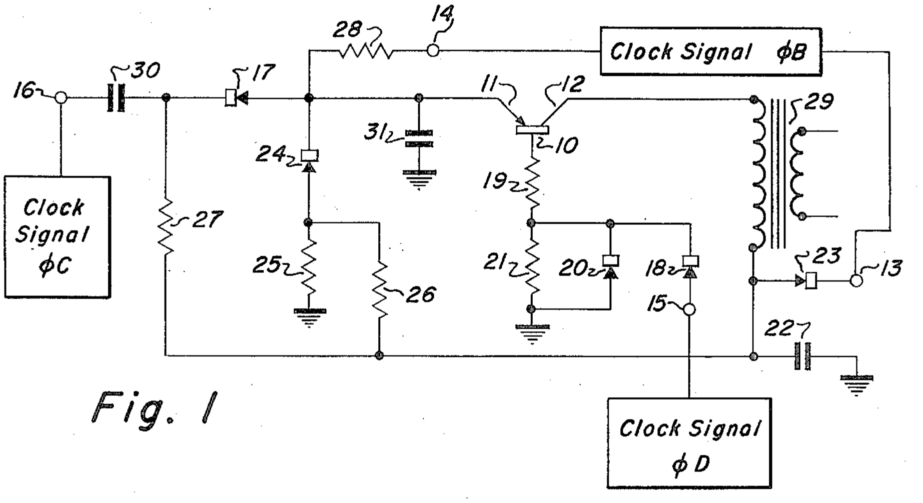
Fig. 1 is a schematic diagram of the regenerative transistor amplifier embodying the invention.

Referring now to the drawings in Fig. 1, there is shown a regenerative amplifier comprising a transistor having a base electrode 10, an emitter electrode 11, and a collector electrode 12. The operation of this transistor amplifier is dependent on a clock signal, as stated before, employed in computers for synchronizing the computing system. The clock signal is a sine wave having four phases, and each phase lags the preceding one by ninety degrees. For the purpose of description the four phases of the clock signal are described as A, B, C and D. Where clock signal phase B is applied to terminals 13 and 14 clock signal, phase D is applied to terminal 15, and an information signal applied to input terminal 16 is timed by clock signal phase C. The amplifier utilizes the clock signal phase D, on the base 10 to turn the transistor on when the information signal applied at input 16 has cut off diode 17. The positive half cycle of the clock signal, phase D, is applied to the base electrode 10 through a diode 18, which is poled for ease in current flow towards the base, and through a base resistor 19. A diode 20 connected between base resistor 19 and ground provides a low impedance path to ground for the transistor base current during its "on" period, and a resistor 21 connected in parallel with diode 20 discharges the stray capacity from the base 10 to ground which would otherwise stay positively charged by the rectified clock signal of phase D and keep the transistor shut off.

The collector 12 voltage is supplied by a capacity 22 which is charged negatively through a diode 23 by the clock signal phase B that is of opposite phase from that applied to the base 10, clock signal phase D. Supplying the collector 12 voltage in this manner results in the capacitor 22 being discharged through the collector 12 while the transistor is turned on. It should be noted here that the current in the collector circuit may be varied by changing the value of capacitor 22.

The voltage on capacitor 22 is also used for D. C. bias in the emitter 11 circuit. The emitter 11 has a clamp diode 24 that is returned to a voltage divider of resistor 25 connected between the diode 24 and ground, and a resistor 26 connected between the diode 24 and capacitor 22. This diode divider supplies the negative bias voltage necessary to keep the transistor shut off in the absence of input signal. The resistance of this divider tends to reduce the emitter current during the "on" period and thereby reduces the collector current. The effect is opposed by the voltage drop in capacitor 22 during the "on" period which tends to make the voltage at the diode 24 more positive. A negative bias to resistor 27 in the emitter 11 gate circuit is supplied by the voltage on capacitor 22, and a positive bias on resistor 28 is supplied by the positive half cycle of phase B of the clock signal supplying the collector 12. The gate circuit referred to comprises diodes 17 and 24 and the associated diode and emitter resistors.

The operation of the transistor amplifier may be best explained by describing how the phases B, C and D of the clock signal are applied to the circuit. It should be remembered that each phase lags the one preceding by ninety degrees. When a positive-going information signal timed by clock signal phase C is applied at the input terminal 16 through coupling capacitor 30, the voltage drop in resistor 27 is increased and diodes 17 and 24 are cut off. Then as clock signal phase B goes positive on resistor 28 and clock signal phase D has dropped the base 10 to ground, current will flow into the emitter and the transistor will flip on its negative input resistance to the high current state where diode 24 becomes conducting. At this point capacitor 22 will commence to discharge through the primary of output transformer 29 and the transistor, thus causing a voltage pulse to appear at the secondary of transformer 29. This discharge of capacitor 22 will continue until its charge is exhausted or until the transistor is shut off by clock signal phase D driving the base positive. It can be seen that the value of capacitor 22 will determine the charge which is put into the collector 12 during the pulse. As the transistor is turned off by clock signal phase D driving the base 10 positive, capacitor 22 will be recharged negatively by clock signal phase B and the circuit will be readied for triggering again.

A list of circuit parameters for the circuit of Fig. 1 are given as being typical for many embodiments of the invention:

| | |
|---|---|
| Resistors **19, 25** | 470 ohms. |
| Resistors **21, 26** | 3900 ohms. |
| Resistor **27** | 12,000 ohms. |
| Resistor **28** | 22,000 ohms. |
| Capacitor **22** | 0.001 microfarad. |
| Capacitor **30** | 0.01 microfarad. |
| Capacitor **31** | 15 micro-farads. |
| Transformer **29** | Miniature ferrite. |

The rectifiers may be any suitable crystal diode or other asymmetrically conducting devices; and the transistor is preferably a unit having a value of $\alpha$ of the order of 2, where $\alpha$ is the short-circuit current amplification factor.

Figure 2:
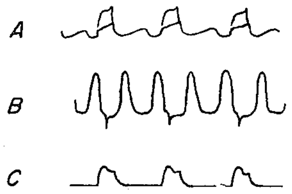
Fig. 2 illustrates various waveforms appearing in the circuit of Fig. 1.

Referring to Fig. 2, there are shown several curves that represent oscilloscope traces taken at various points in the transistor amplifier. Curve A is of special interest as it shows the collector voltage superimposed on the voltage appearing across capacitor 22 of Fig. 1. This illustrates the decrease in the charge on capacitor 22 during the "on" period. The drop in voltage on capacitor 22, when the transistor is turned off, is caused by the drain of the emitter bias and gate resistors. Curve B shows a scope trace taken from the base of the transistor of Fig. 1, which illustrates that the transistor fires a very short time after the clock signal phase D has fallen below ground. This is a result of the time required for the sine wave voltage on the emitter resistor 28 of Fig. 1, to build up sufficient triggering current for the transistor. Curve C shows the output pulse taken from the secondary winding of transformer 29 of Fig. 1. This output pulse can drive several similar transistor amplifiers connected in parallel.

Figure 3:
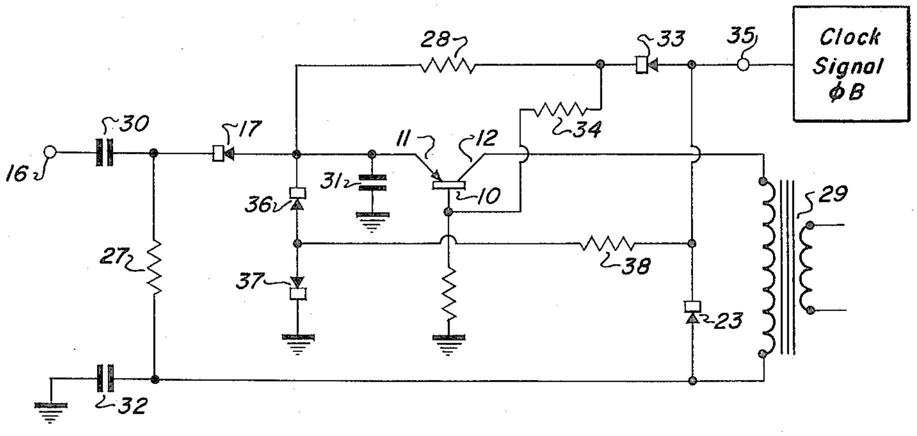
Fig. 3 is a schematic diagram of a variation of the embodiment of the invention shown in Fig. 1.

A variation of the circuit of Fig. 1 is shown in Fig. 3. In the circuit of Fig. 3 the transistor turn-on and turn-off are controlled by the clock signal in the emitter circuit instead of in the base circuit. In this circuit the collector 12 and the emitter resistor 27 are supplied negative rectified clock signal current from capacitor 32 connected between resistor 27 and ground. The clock signal current on capacitor 32 is rectified by diode 23. The capacitor 32, if large enough, will give good voltage regulation. The transistor is biased below the peak point by rectified clock signal from diode 33 applied to the base 10 through a resistor 34. Phase B of the clock signal is applied to terminal 35. This same signal supplies triggering current through the emitter resistor 28, connected between the diode 33 and the emitter 11. The transistor emitter 11 is returned to ground through diodes 36 and 37, and the clock signal from terminal 35 is applied to the midpoint of these diodes through resistor 38. It is this clock signal which controls firing and turn-off time.

Only one phase is required to supply the amplifier of Fig. 3 and its operation may be best explained by applying this phase to the circuit. When a positive-going signal, timed by clock signal phase A in a similar amplifier, is applied to the input terminal 16, thus cutting off diode 17, and when clock signal phase B goes positive one-quarter cycle later, the transistor will be triggered by current into the emitter 11 through resistor 28. At the same time, diode 37 is made conducting by the clock signal applied through resistor 38. As the emitter voltage falls negative following triggering, diode 36 will become conducting and emitter current limited by the current in diode 37 will flow. This in turn allows collector current to flow through the output transformer 29, thus producing an output signal. As the clock signal goes negative again, crystal diodes 36 and 37 are shut off, the emitter 11 goes negative past cut-off, and the collector voltage sweeps out the stored charge turning off the transistor.

It will thus be seen that what has been described are two regenerative transistor amplifiers operating entirely from several phases of a synchronizing signal employed in computers. Other variations will be apparent to those skilled in the art without departing from the principles of this invention. Therefore the present invention is to be considered limited only by the appended claims as interpreted in view of the prior art.

What is claimed is:

1. A regenerative amplifier for producing an output pulse when digital information pulses are applied thereto, comprising a transistor having emitter, collector and base electrodes, an input circuit connected to said emitter electrode, an output circuit connected to said collector electrode, means for generating first, second and third phases of sinusoidal signal voltages, each phase lagging the preceding phase by approximately 90 degrees, a capacitor connected to the input and output circuits adapted to be charged in response to said first phase for negatively biasing said emitter and collector electrodes, means responsive to said first phase for positively biasing said emitter electrode, means for grounding said base electrode from said third phase simultaneously with the occurrence of the information pulses and the positive emitter bias to trigger the transistor to its high current state and discharge said capacitor across said output circuit, and for subsequently positively biasing said base electrode from said third phase to trigger the transistor to its low current state, and an asymmetrically conducting device poled in the direction of negative capacitor charging current connected between said generating means and said capacitor.

2. A regenerative amplifier for producing an output pulse when digital information pulses are applied thereto comprising a transistor having emitter, collector and base electrodes, an input circuit connected to said emitter electrode, said input circuit including an asymmetrically conducting device poled in the direction opposite to that of positive emitter current, an output circuit connected to said collector electrode, said output circuit including an impedance matching transformer having primary and secondary windings, means for generating first, second and third phases of sinusoidal signal voltages, each phase lagging the preceding phase by approximately 90 degrees, a capacitor connected between the junction of the input and output circuits and ground adapted to be charged in response to said first phase through an asymmetrically conducting device poled in the direction of negative capacitor charging current connected between said phase generating means and said capacitor for negatively biasing said emitter and collector electrodes, means for applying information pulses timed by said second phase to said input circuit, means responsive to said first phase for positively biasing said emitter electrode, and means for grounding said base electrode from said third phase simultaneously with the occurrence of the information pulses and the positive emitter bias to trigger the transistor to its high current state and discharge said capacitor across said transformer primary winding, and for subsequently positively biasing said base electrode from said third phase to trigger the transistor to its low current state, said means including an asymmetrically conducting device poled in the direction opposite to that of positive emitter current.

References Cited in the file of this patent

UNITED STATES PATENTS

| | | |
|---|---|---|
| 2,627,039 | MacWilliams | Jan. 27, 1953 |
| 2,665,405 | Cyr | Jan. 5, 1954 |
| 2,667,614 | Covill | Jan. 26, 1954 |
| 2,680,160 | Yaeger | June 1, 1954 |
| 2,760,087 | Felker | Aug. 21, 1956 |

OTHER REFERENCES

Publication: "Electronics," May 1954, pp. 160–161.